(12) United States Patent
Solihin

(10) Patent No.: US 9,858,111 B2
(45) Date of Patent: Jan. 2, 2018

(54) HETEROGENEOUS MAGNETIC MEMORY ARCHITECTURE

(71) Applicant: EMPIRE TECHNOLOGY DEVELOPMENT LLC, Wilmington, DE (US)

(72) Inventor: Yan Solihin, Raleigh, NC (US)

(73) Assignee: EMPIRE TECHNOLOGIES DEVELOPMENT LLC, Wilmington, DE (US)

( * ) Notice: Subject to any disclaimer, the term of this patent is extended or adjusted under 35 U.S.C. 154(b) by 528 days.

(21) Appl. No.: 14/308,262

(22) Filed: Jun. 18, 2014

(65) Prior Publication Data

US 2015/0371694 A1   Dec. 24, 2015

(51) Int. Cl.
| | |
|---|---|
| G06F 9/46 | (2006.01) |
| G06F 12/08 | (2016.01) |
| G06F 1/32 | (2006.01) |
| G06F 15/80 | (2006.01) |
| G11C 11/16 | (2006.01) |
| G06F 12/0842 | (2016.01) |

(52) U.S. Cl.
CPC ............ *G06F 9/466* (2013.01); *G06F 1/3275* (2013.01); *G06F 12/0842* (2013.01); *G06F 15/80* (2013.01); *G11C 11/161* (2013.01); *G06F 2212/283* (2013.01); *Y02B 60/1225* (2013.01); *Y02B 60/1228* (2013.01)

(58) Field of Classification Search
CPC ...................................................... G06F 9/466
See application file for complete search history.

(56) References Cited

U.S. PATENT DOCUMENTS

| | | | |
|---|---|---|---|
| 5,319,766 A | 6/1994 | Thaller et al. | |
| 8,683,243 B2 * | 3/2014 | Wu ........................ | G06F 1/3287 |
| | | | 713/320 |
| 2005/0211978 A1 * | 9/2005 | Bu ........................ | B82Y 10/00 |
| | | | 257/40 |

(Continued)

OTHER PUBLICATIONS

Mohammad Hammoud, Sangyeun Cho, and Rami Melhem. 2008. ACM: An Efficient Approach for Managing Shared Caches in Chip Multiprocessors. In Proceedings of the 4th International Conference on High Performance Embedded Architectures and Compilers (HiPEAC '09). (Hereafter known as "Hammound").*

(Continued)

*Primary Examiner* — Aimee Li
*Assistant Examiner* — William Nguyen
(74) *Attorney, Agent, or Firm* — Morritt Hock & Hamroff LLP; Steven S. Rubin, Esq.

(57) ABSTRACT

Technologies are generally described for systems, devices and methods relating to multicore processors. The multicore processors may include first and second tiles with first and second caches, respectively. The first cache may include first magnetoresistive random access memory (MRAM) cells with first storage characteristics. The second cache may include second MRAM cells with second storage characteristics different from the first storage characteristics. In some examples, an interconnect structure may be coupled to the first and second tiles and may be configured to provide communication between the first tile and the second tile. Methods for handling migration between tiles and cores are also described.

18 Claims, 8 Drawing Sheets

(56) References Cited

U.S. PATENT DOCUMENTS

| | | | | |
|---|---|---|---|---|
| 2005/0221511 | A1* | 10/2005 | Wang | G11C 7/18 438/3 |
| 2006/0087013 | A1* | 4/2006 | Hsieh | H01L 25/0652 257/678 |
| 2013/0110407 | A1* | 5/2013 | Baccash | G06F 19/24 702/19 |
| 2013/0279244 | A1* | 10/2013 | Kang | G11C 11/161 365/158 |
| 2014/0047184 | A1* | 2/2014 | Kang | G06F 12/0893 711/122 |

OTHER PUBLICATIONS

Sun (Zhenyu Sun, Xiuyuan Bi, Hai (Helen) Li, Weng-Fai Wong, Zhong-Liang Ong, Xiaochun Zhu, and Wenqing Wu. 2011. Multi retention level STT-RAM cache designs with a dynamic refresh scheme. In Proceedings of the 44th Annual IEEE/ACM International Symposium on Microarchitecture (MICRO-44). ACM, New York, NY, USA, 329-338. DOI=http://dx.doi.org/10.1145.*

Fruhlinger, Joshua, "Toshiba says its 1GB MRAM chips are 'almost ready,' we're ready now". Engadget, Jun 2, 2008. Retreived from https://web.archive.org/web/20081008050118/http://www.engadget.com/2008/06/02/toshiba-says-its-1gb-mram-chips-are-almost-ready-were-ready/.*

Chang, M-T. et al., "Technology Comparison for Large last-Level Caches (L3Cs): Low-Leakage SRAM, Low Write-Energy STT-RAM, and Refresh-Optimized eDRAM," IEEE International Symposium on High Performance Computer Architecture (HPCA), 2013, pp. 12.

Jog, A. et al., "Cache Revive: Architecting Volatile STT-RAM Caches for Enhanced Performance in CMPs," Design Automation Conference (DAC), Jun. 3-7, 2012, pp. 10.

Mishra, A. K. et al., "Architecting On-Chip Interconnects for Stacked 3D STT-RAM Caches in CMPs," Proceedings of the 38th annual international symposium on Computer architecture, Jun. 2011, pp. 69-80, vol. 39, No. 3.

Sun, Z. et al., "Multi Retention Level STT-RAM Cache Designs with a Dynamic Refresh Scheme," Proceedings of the 44th Annual IEEE/ACM International Symposium on Microarchitecture, Dec. 3-7, 2011, pp. 329-338.

Xu, W. et al., "Design of Last-Level On-Chip Cache Using Spin-Torque Transfer RAM (STT RAM)," Abstract, IEEE Transactions on Very Large Scale Integration (VLSI) Systems, Mar. 2011, pp. 483-493, vol. 19, No. 3.

* cited by examiner

700 A computer program product.

702 A signal bearing medium.

704

At least one of

One or more instructions for a method to migrate a thread from a first core to a second core on a multicore processor; or One or more instructions to determine, at the first core, a first probability of an instruction of the thread experiencing a first cache miss at a first cache associated with the first core; or One or more instructions to estimate, based on a memory array of the first cache associated with the first core, a second probability of the instruction of the thread experiencing a second cache miss at a second cache associated with the second core; or One or more instructions to, calculate a difference value between the first probability and the second probability; or One or more instructions to migrate the thread from the first core to the second core in response to the difference value being above a threshold.

| 706 A computer readable medium | 708 A recordable medium | 710 A communications medium |

Fig. 7

HETEROGENEOUS MAGNETIC MEMORY ARCHITECTURE

BACKGROUND

Unless otherwise indicated herein, the materials described in this section are not prior art to the claims in this application and are not admitted to be prior art by inclusion in this section.

In digital computing architecture, memory technologies may have different characteristics such as retention time, write energies, read energies, write times and/or read times. Additionally, different memory cell technologies may have particular size characteristics and varying degrees of scalability. Memory technologies may be used to store data and may be volatile or nonvolatile.

SUMMARY

In some examples, multicore processors are generally described. In some examples, the multicore processors may include a die. In other examples, the die may include a first tile. The first tile may include a first core and a first cache. The first cache may be configured to be in communication with the first core. In various examples, the first cache may include first magnetoresistive random access memory (MRAM) cells with first storage characteristics. In some other examples, the die may include a second tile. The second tile may include a second core and a second cache configured to be in communication with the second core. In some examples, the second cache may include second MRAM cells with second storage characteristics. In various examples, the second storage characteristics may be different from the first storage characteristics. In still other examples, the die may include an interconnect structure coupled to the first and second tiles. In some examples, the interconnect structure may be configured to provide communication between the first tile and the second tile.

In some examples, methods to migrate a thread from a first core to a second core on a multicore processor are generally described. In various examples, the methods may include determining, at the first core, a first probability of an instruction of the thread experiencing a first cache miss at a first cache associated with the first core. In some other examples, the methods may include estimating, based on a memory array of the first cache associated with the first core, a second probability of the instruction of the thread experiencing a second cache miss at a second cache associated with the second core. In still other examples the methods may include calculating a difference value between the first probability and the second probability. In yet other examples, the methods may include migrating the thread from the first core to the second core in response to the difference value being above a threshold.

In some other examples, multicore processors are generally described. In some examples, the multicore processors may include a die. In various examples, the die may include a first tile on the die. The first tile may include a first core and a first cache configured to be in communication with the first core. The first cache may include first magnetoresistive random access memory (MRAM) cells with first storage characteristics and an array of second MRAM cells with second storage characteristics. In some other examples, the die may include a second tile. In some examples, the second tile may include a second core and a second cache configured to be in communication with the second core. The second cache may include third MRAM cells with third storage characteristics different from the first storage characteristics. In some examples, the second cache may further include an array of fourth MRAM cells with fourth storage characteristics. In other examples, the die may include an interconnect structure coupled to the first and second tiles. In various examples, the interconnect structure may be configured to provide communication between the first tile and the second tile.

In some other examples, non-transitory, computer-readable mediums are generally described. In various examples, the computer-readable mediums may include computer-readable instructions stored thereon that may be executable to cause a processor to determine, at the first core, a first probability of an instruction of the thread experiencing a first cache miss at a first cache associated with the first core. In some other examples, the computer-readable mediums may include computer-readable instructions stored thereon that may be executable to cause the processor to estimate, based on a memory array of the first cache associated with the first core, a second probability of the instruction of the thread experiencing a second cache miss at a second cache associated with the second core. In still other examples the computer-readable mediums may include computer-readable instructions stored thereon that may be executable to cause the processor to calculate a difference value between the first probability and the second probability. In yet other examples, the computer-readable mediums may include computer-readable instructions stored thereon that may be executable to cause the processor to migrate the thread from the first core to the second core in response to the difference value being above a threshold.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 7 illustrates an example computer program product that can be utilized to operate a heterogeneous magnetic memory architecture;

Figure 1:
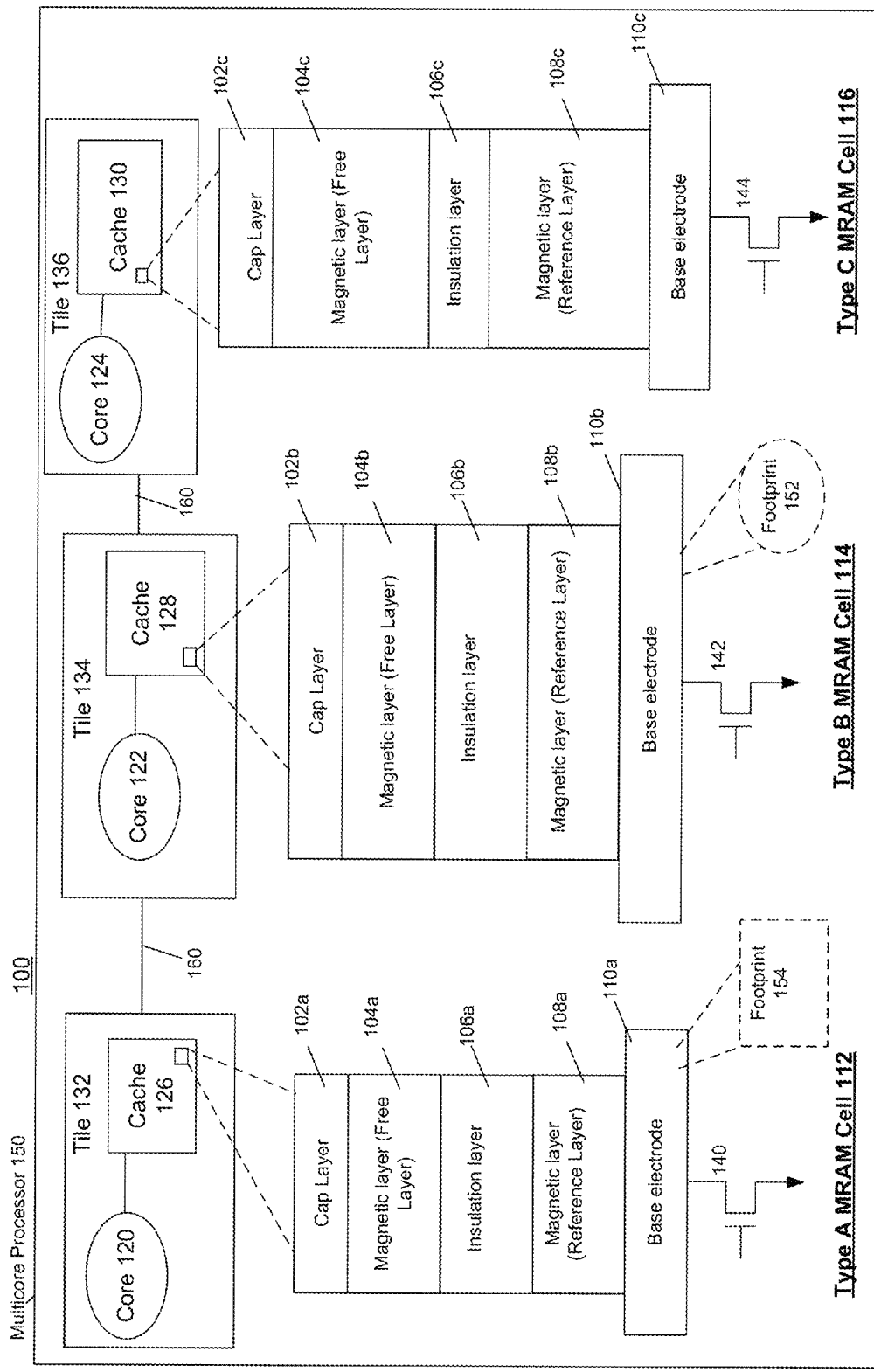
FIG. 1 illustrates an example system that can be utilized to implement a heterogeneous magnetic memory architecture.

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the drawings, can be arranged, substituted, combined, separated, and designed in a wide variety of different configurations.

This disclosure is generally drawn to, inter alia, methods, apparatus, systems, devices, and computer program products related to a heterogeneous magnetic memory architecture. Magnetic memory architecture may include various magnetic memory including STT (spin-transfer torque) RAM or traditional magneto-resistive RAM, all collectively referred to as MRAM in this disclosure.

Briefly stated, technologies are generally described for systems, devices and methods relating to multicore processors. The multicore processors may include first and second tiles with first and second caches, respectively. The first cache may include first magnetoresistive random access memory (MRAM) cells with first storage characteristics. The second cache may include second MRAM cells with second storage characteristics different from the first storage characteristics. In some examples, an interconnect structure may be coupled to the first and second tiles and may be configured to provide communication between the first tile and the second tile. Methods for handling migration between tiles and cores are also described.

FIG. 1 illustrates an example system 100 that can be utilized to implement a heterogeneous memory architecture arranged according to at least some embodiments described herein. System 100 may include one or more tiles of a multicore processor 150, such as tiles 132, 134 and/or 136. Tiles 132, 134 and 136 may each include a processor core (such as, for example, cores 120, 122 and/or 124) and one or more caches (such as, for example, caches 126, 128 and/or 130) respectively coupled thereto. Tiles 132, 134, and/or 136 may be configured to be in communication with one another through one or more interconnect structures 160. Interconnect structures 160 may be, for example, a communication bus, via, crossbar and/or another communication channel.

Caches 126, 128 and/or 130 may include memory technologies which may be used to implement a heterogeneous memory architecture. In some examples, caches 126, 128 and/or 130 may include magnetoresistive random access memory ("MRAM") cells. MRAM may be a memory technology effective to store a bit by holding a magnetic field on a ferromagnetic plate. As will be discussed in further detail below, different types of MRAM cells may have different storage characteristics. MRAM cells, such as Type A MRAM Cell 112, Type B MRAM Cell 114, and Type C MRAM Cell 116 may include cap layers 102 (including cap layers 102a, 102b, and 102c), magnetic layers 104 (including magnetic layers 104a, 104b, 104c), magnetic layers 108 (108a, 108b and 108c), insulation layers 106 (including insulation layers 106a, 106b, and 106c), and base electrodes 110 (including base electrodes 110a, 110b, and 110c). Magnetic layers 108 may be reference layers configured to hold a magnetic field that may be oriented towards a pole. Magnetic layers 104 may be free layers configured to hold a magnetic field as a stored bit. For example, a magnetic field induced on magnetic layer 104a may be oriented to point in the same direction or the opposite direction as the magnetic field held by magnetic layer 108a depending on whether Type A MRAM Cell 112 is to encode a binary value of "0" or a binary value of "1."

Insulation layers 106 may be disposed between magnetic layers 104 and 108. Insulation layers 106 may isolate magnetic layers 104 and 108 such that magnetic fields held by magnetic layers 104 and/or 108 may be maintained. Cap layers 102 may be formed on top of MRAM Cells 112, 114 and/or 116 to isolate a top portion of the cells. Base electrodes 110 may be configured to allow data to be read from and/or written to MRAM Cells 112, 114 and/or 116 through operation of transistors 140, 142, and/or 144 coupled to base electrodes 110. Cap layers 102, magnetic layers 104 and 108, and insulation layers 106 may have different dimensions for each of Type A MRAM Cell 112, Type B MRAM Cell 114, and/or Type C MRAM Cell 116. For example, a thickness of magnetic layer 104a may be different than a thickness of magnetic layer 104c. The thickness of a particular layer may refer to the distance between a layer immediately above the particular layer and a layer immediately below the particular layer. In another example of dimensions of MRAM Cells 112, 114, and/or 116, each cell may have a different area or footprint when viewed from above. For example, Type B MRAM Cell 114 may have a footprint 152 when viewed from above while Type A MRAM Cell 112 may have a smaller (and/or other different relative size or shape) footprint 154 when viewed from above.

The retaining time of an MRAM cell may obey equation (1):

$$\tau = ae^{b\frac{V}{T}} \qquad (1)$$

where τ may be retaining time, a and b may be constants, V may be the volume of magnetic layers 104, 108, and T may be temperature. Accordingly, higher retention time in MRAM cells may be dependent on the volume of free magnetic layers 104. Type B MRAM Cell 114 and Type C MRAM Cell 116 may have a higher retention time relative to Type A MRAM Cell 112 as free magnetic layers 104b and 104c may have a higher volume relative to free magnetic layer 104a of Type A MRAM Cell 112. For example, Type B MRAM Cell 114 may include a larger area for free magnetic layer 104b relative to the area of free magnetic layer 104a. In another example, free magnetic layer 104c of Type C MRAM Cell 116 may be of a greater thickness or height relative to free magnetic layer 104a of Type A MRAM Cell 112. Accordingly, Type B MRAM Cells 114 and Type C MRAM Cells 116 may have greater retention times for stored bits relative to Type A MRAM Cells 112. Type A MRAM Cells 112 may operate with a smaller write time and/or write energy relative to write times and write energies of Type B MRAM Cells 114 and/or Type C MRAM Cells 116. In some examples, the dimensions (including height, length and/or width) may be different for Type A MRAM Cells 112, Type B MRAM Cells 114, and Type C MRAM Cells 116.

Figure 2:
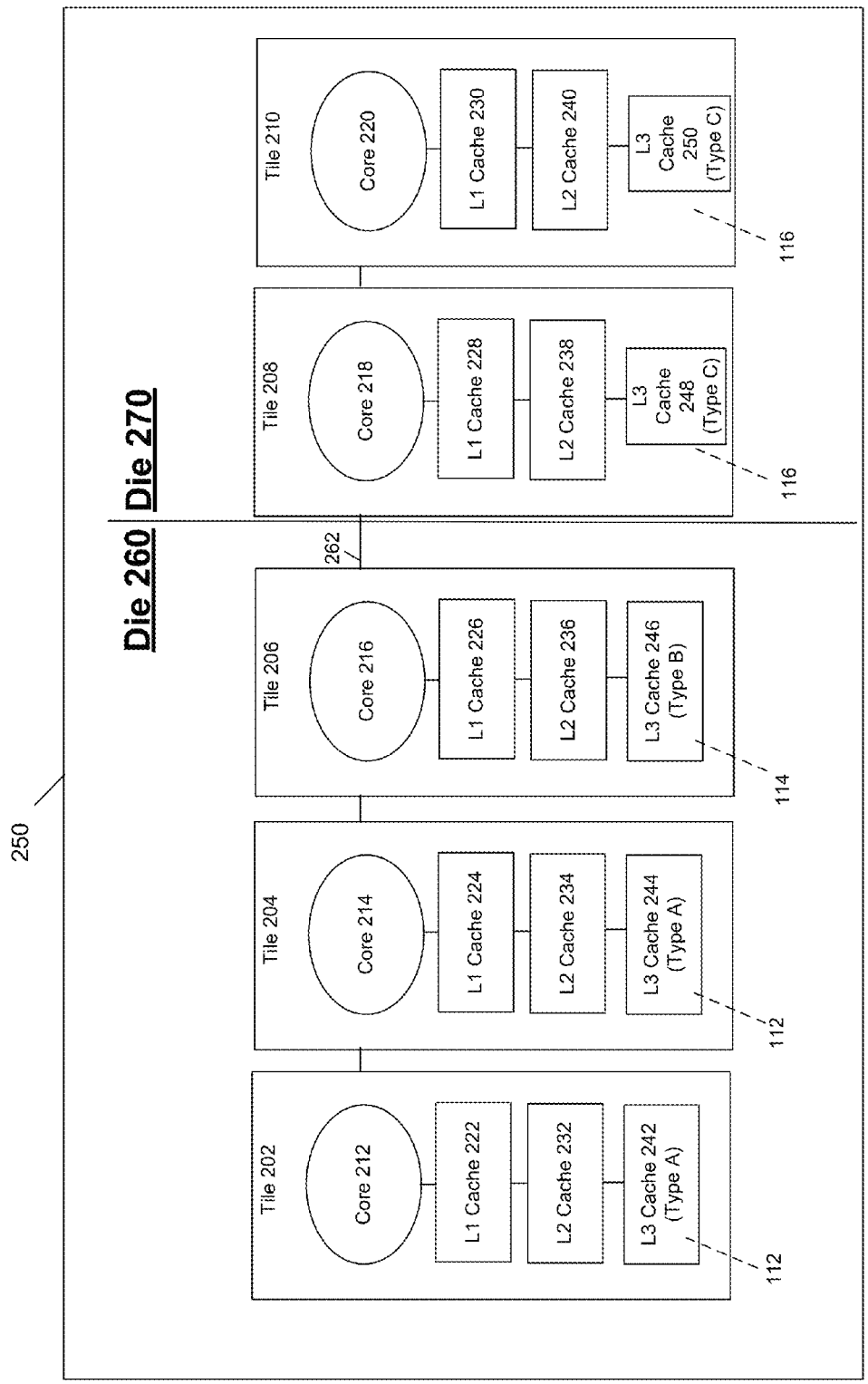
FIG. 2 depicts an example system that may be used to implement a heterogeneous magnetic memory architecture, including additional details related to dies.

FIG. 2 depicts an example system that may be used to implement a heterogeneous magnetic memory architecture, including additional details related to dies, arranged in accordance with at least some embodiments described herein. Those components in FIG. 2 that are labeled identically to components of FIG. 1 will not be described again for the purposes of clarity and brevity.

In some examples, a multicore processor system 250 may include dies 260 and 270 that may be configured to be in communication with each other such as through a coupling 262. Multicore processor system 250 may be used in conjunction with multicore processor 150. Die 260 may include tiles 202, 204, and/or 206. Die 270 may include tiles 208 and/or 210. Tiles 202, 204, 206, 208 and/or 210 may each include a processor core (such as cores 212, 214, 216, 218 and/or 220), an L1 cache (such as L1 caches 222, 224, 226, 228, and/or 230), an L2 cache (such as L2 caches 232, 234, 236, 238, and/or 240), and an L3 cache (such as L3 caches 242, 244, 246, 248, and/or 250) coupled to each other. In some examples, L3 caches 242, 244 may include Type A MRAM Cells 112. L3 cache 246 may include Type B MRAM Cells 114. L3 caches 248 and/or 250 may include Type C MRAM Cells 116. Type A MRAM Cells 112 and Type B MRAM Cells 114 may be of the same or substantially the same thickness and/or height. Type C MRAM Cells 116 may be disposed on die 270 and may include a thickness and/or height that are different from layers in Type A MRAM Cells 112 and Type B MRAM Cells 114. Coupling 262 may be, for example, a bus, interconnect, via, or other communication channel or structure. Coupling 262 may be configured to allow for communication between die 260 and die 270.

Figure 3:
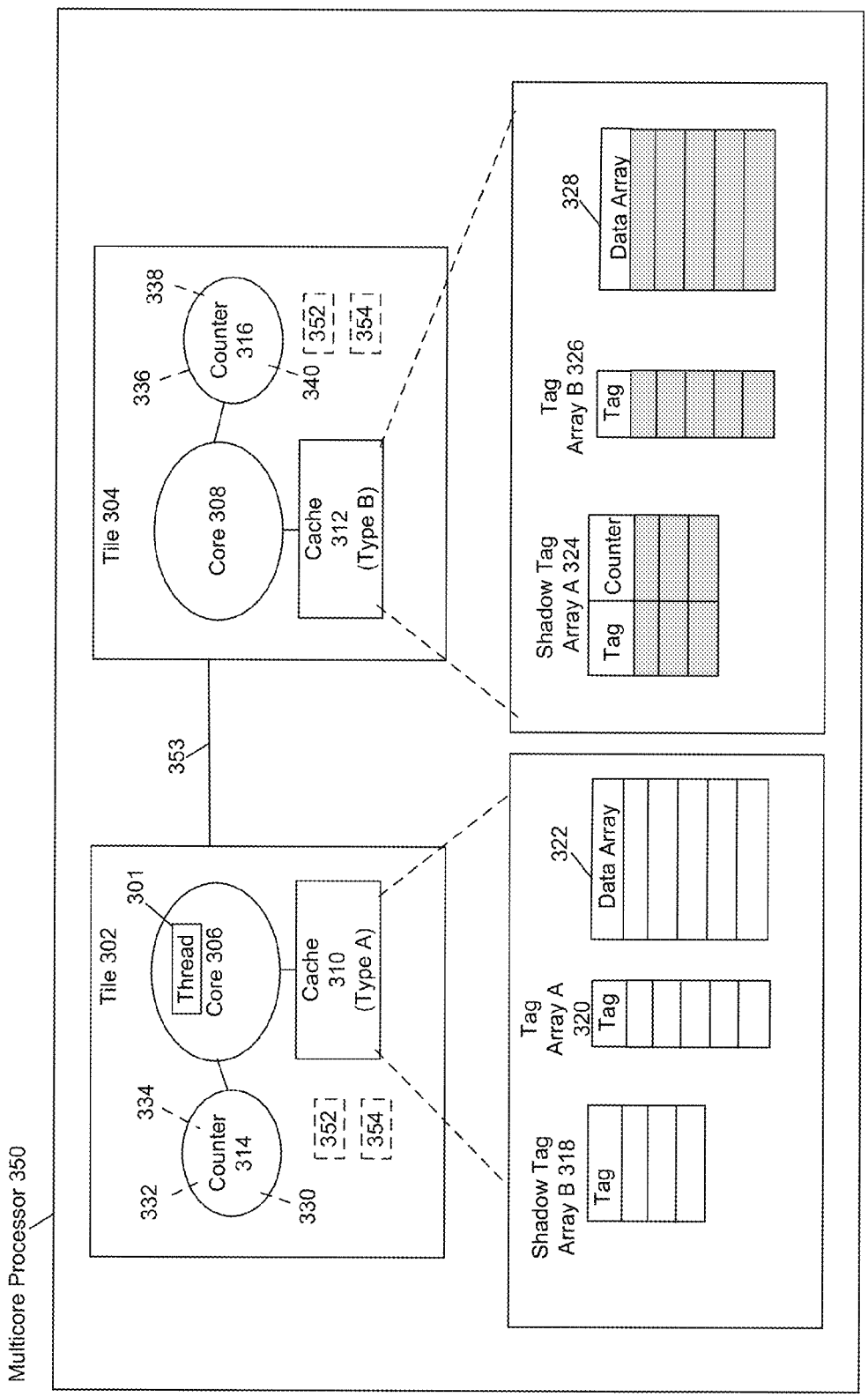
FIG. 3 depicts an example multicore processor that may be used to implement heterogeneous magnetic memory architecture, including additional details relating to shadow tag arrays which may emulate a first type of memory cells.

FIG. 3 depicts an example multicore processor that may be used to implement heterogeneous magnetic memory architecture, including additional details relating to shadow tag arrays which may emulate a first type of memory cells, arranged in accordance with at least some embodiments described herein. Those components in FIG. 3 that are labeled identically to components of FIGS. 1 and 2 will not be described again for the purposes of clarity and brevity.

A multicore processor 350 may include tiles 302 and 304 configured to be in communication with one another through an interconnect structure 353. Interconnect structure 353 may be, for example, a bus, interconnect, via, or other communication channel. Interconnect structure 353 may be configured to allow for communication between tiles 302 and 304. Tile 302 may include a processor core 306, a counter 314, and one or more caches, such as, for example, cache 310, all configured to be coupled to or otherwise in communication with one another. Tile 304 may include a processor core 308, a counter 316 and one or more caches, such as, for example, cache 312, all configured to be coupled to or otherwise in communication with one another. In some examples, cache 310 may include Type A MRAM Cells 112. In other examples, cache 312 may include Type B MRAM Cells 114. In some other examples, cache 310 may include non-MRAM memory cells which may have different retention times, different write times, and/or different write energies relative to memory cells of cache 312. As will be discussed in further detail below with reference to FIG. 4, cache 312 may include shadow tag array A 324, tag array B 326 and data array 328.

As is explained in more detail below, a first core may determine whether to migrate a thread to a second core associated with a different memory type based on a particular metric. For example, the metric may relate to power consumption or latency. As will be discussed in further detail below, a first core may determine energy usage per instruction ("EPI") of a thread at the first core and at a second core with a different memory type. Based on that calculation, the core may determine whether or not to migrate the thread from the first core to the second core.

For example, $EPI_A$ may be the energy per instruction which may be consumed by core 306 when executing a thread 301 with instructions. $EPI_A$ may obey equation (2):

$$EPI_A = EPI_{base} + P_{rd} \times E_{rd} + P_{wr} \times E_{wr,A} + P_{miss,A} \times E_{miss} \quad (2)$$

where $EPI_A$ may be the energy per instruction for a core that uses Type A MRAM Cells 112. $EPI_{base}$ may be the energy per instruction for all caches associated with core 306 which do not use MRAM memory cells. $P_{rd}$ may be the probability that an instruction will read from cache 310, while $P_{wr}$ may be the probability that an instruction will write to cache 310. $E_{rd}$ may be the energy consumed per read access to cache 310, while $E_{wr,A}$ may be the energy consumed per write access to a cache including Type A MRAM Cells 112 (e.g., cache 310). $P_{miss,A}$ may be, for example, the probability of a cache miss for an instruction that executes on a core with Type A MRAM Cells 112 (e.g., core 306 with associated cache 310).

$EPI_B$ may be the energy per instruction which may be consumed by core 308 when executing an instruction for thread 301. $EPI_B$ may obey equation (3):

$$EPI_B = EPI_{base} + P_{rd} \times E_{rd} + P_{wr} \times E_{wr,B} + P_{miss,B} \times E_{miss} \quad (3)$$

where $EPI_B$ may be the energy per instruction for a core that uses Type B MRAM Cells 114. $EPI_{base}$ may be the energy per instruction for all caches associated with core 308 which do not use MRAM memory cells. $P_{rd}$ may be the probability that an instruction will read from cache 312, while $P_{wr}$ may be the probability that an instruction will write to cache 312. $E_{rd}$ may be the energy consumed per read access to cache 312 while $E_{wr,B}$ may be the energy consume per write access to a cache including Type B MRAM Cells 114 (e.g., cache 312). $P_{miss,B}$ may be, for example, the probability of a cache miss for an instruction in thread 301 that executes on a core with Type B MRAM Cells 114 (e.g., core 308 with associated cache 312).

In some examples, it may be more energy efficient for thread 301 being executed by core 306 to be executed by core 308, in cases where $EPI_B < EPI_A$. Equations (2) and (3) above may be rearranged to satisfy $EPI_B < EPI_A$ and to produce equation (4):

$$P_{miss,A} - P_{miss,B} > \frac{P_{wr}}{E_{miss}}(E_{wr,B} - E_{wr,A}) \quad (4)$$

If the inequality in equation (4) is satisfied, it may be more energy efficient for thread 301 being executed by core 306 to be executed by core 308. In some examples, core 306 and/or core 308 may be configured to execute instructions 352 to determine parameters of equation (4) and to solve equation (4). Instructions 352 may be stored in cache 310, cache 312, and/or another memory associated with core 306 and/or core 308. In some examples, the term on the right side of the inequality in equation (4) may be a threshold value.

$P_{wr}$ may be determined by cores 306, 308 or by a logic unit of cores 306, 308. For example, counters 314, 316 may count values related to the number of cache write events and the total number of executed instructions for a particular time interval. Cores 306, 308 (or a logic unit of cores 306, 308) may determine $P_{wr}$ as the ratio between the number of cache write events and the total number of executed instructions based on values stored by counter 314 and/or counter 316. $E_{miss}$, $E_{wr,B}$, and $E_{wr,A}$ may be empirically determined or known based on manufacturer specifications.

For thread 301 that is currently executing on core 306, $P_{miss,A}$ may be determined based on a ratio of the number of cache 310 misses to the total number of instructions executed by core 306. Counter 314 may be used to generate a counter value 334 which may represent the number of instructions executed by core 306 during a time interval. Counter 314 may be used to generate counter value 330 which may represent the number of cache misses experienced by thread 301 executed on core 306 during the time interval.

A tag array A 320 may be a data structure configured to store tags related to data stored in data array 322 of cache 310. Core 306 may be configured to consult tag array A 320 to determine whether data implicated by thread 301 under execution by core 306 may be stored in data array 322. If core 306 determines, based on tags stored in tag array A 320, that data implicated by an instruction currently being executed is not stored in data array 322 (e.g., a "cache miss"), core 306 may instruct counter 314 to increase a counter value 330. Core 306 may determine $P_{miss,A}$ by taking a ratio of counter value 330 to counter value 334 for the time interval. In an example, the time interval may be smaller than a time quantum for an operating system of multicore processor 150. A time quantum for an operating system may be the smallest (or relatively smaller) unit of time during which the operating system allows a process to run without any interruption or preemption.

For thread 301 that is currently executing on core 306, $P_{miss,B}$ may be estimated based on a ratio of an estimated number of cache misses expected if thread 301 was executing on a core with a cache of Type B MRAM Cells 114 to the total number of instructions executed by core 306. A shadow tag array B 318 may be a data structure configured to emulate data storage properties of cache 312. Shadow tag array B 318 may include memory cells with a longer retention time relative to Type A MRAM Cells 112. In some examples, shadow tag array B 318 may store a representative number of tags which is less than the total number of blocks in data array 322. Tags stored in shadow tag array B 318 may be stored for a length of time that may approximate a retention time of data stored in higher retention memory cells (such as Type B MRAM Cells 114 of Cache 312).

Counter 314 may be used to generate counter value 332. Counter value 332 may represent the estimated number of cache misses that would be experienced by thread 301, if thread 301 were executed on core 308 with a cache of Type B MRAM Cells 114 (such as cache 312, for example). Core 306 may determine $P_{miss,B}$ by taking a ratio of counter value 332 to counter value 330 for a particular time interval.

After determining unknown values of equation (4), core 306 may determine whether the inequality in equation (4) is satisfied. If equation (4) is satisfied, suggesting that thread 301 may expend less energy on tile 304, core 306 may migrate thread 301 that is under execution by core 306 to core 308. If not, core 306 may continue to execute thread 301. An energy cost related to thread migration from one core to another may be added as an additional term to the right hand side of equation (4) to take into account energy that may be expended during thread migration.

In another example, a first core may determine whether to migrate a thread to a second core associated with a different memory type based on a time or a latency of instruction execution. As will be discussed in further detail below, a first core may determine clock cycles elapsed per instruction ("CPI") of a thread at the first core and at a second core with a different memory type. Based on that calculation, the core may determine whether or not to migrate the thread via interconnect structure 353.

For example, $CPI_A$ may be the clock cycles elapsed per instruction executed by core 306 for thread 301. $CPI_A$ may obey equation (5):

$$CPI_A = CPI_{base} + P_{rd} \times T_{rd,A} + P_{wr} \times T_{wr,A} + P_{miss,A} \times T_{miss} \quad (5)$$

where $CPI_A$ may be the clock cycles elapsed per thread for a core that uses Type A MRAM Cells 112. $CPI_{base}$ may be the clock cycles elapsed per thread for all caches associated with core 306 which do not use MRAM memory cells. $P_{rd}$ may be the probability that an instruction will read from cache 310, while $P_{wr}$ may be the probability that a thread will write to cache 310. $T_{rd,A}$ may be the average number of clock cycles elapsed per read access to cache 310, while $T_{wr,A}$ may be the average number of clock cycles elapsed per write access to a cache including Type A MRAM Cells 112 (e.g., cache 310). $P_{miss,A}$ may be, for example, the probability of a cache miss for a thread that executes on a core with Type A MRAM Cells 112 (e.g., core 306 with associated cache 310).

$CPI_B$ may be the energy per instruction which may be consumed by core 308 when executing a thread. $EPI_B$ may obey equation (6):

$$CPI_B = CPI_{base} + P_{rd} \times T_{rd,A} + P_{wr} \times T_{wr,B} + P_{miss,B} \times T_{miss} \quad (6)$$

where $CPI_B$ may be the clock cycles elapsed per instruction for a core that uses Type B MRAM Cells 114. $CPI_{base}$ may be the clock cycles elapsed per instruction for caches associated with core 308 which do not use MRAM memory cells. $P_{rd}$ may be the probability that an instruction will read from cache 312, while $P_{wr}$ may be the probability that an instruction will write to cache 312. $T_{rd,A}$ may be the average number of clock cycles elapsed per read access to cache 312 while $T_{wr,B}$ may be the average number of clock cycles elapsed per write access to a cache including Type B MRAM Cells 114 (e.g., cache 312). $P_{miss,B}$ may be, for example, the probability of a cache miss for an instruction that executes on a core with Type B MRAM Cells 114 (e.g., core 308 with associated cache 312).

In some examples, thread 301 under execution by core 306 may be executed in fewer clock cycles by core 308, in cases where $CPI_B < CPI_A$. Equations (5) and (6) above may be rearranged to satisfy $CPI_B < CPI_A$ and to produce equation (7):

$$P_{miss,A} - P_{miss,B} > \frac{P_{wr} \times (T_{wr,B} - T_{wr,A}) + P_{rd} \times (T_{rd,B} - T_{rd,A})}{T_{miss}} \quad (7)$$

If the inequality in equation (7) is satisfied, thread 301 under execution by core 306 may be executed in fewer clock cycles by core 308. In some examples, core 306 and/or core 308 may be configured to execute instructions 354 to determine parameters of equation (7) and to solve equation (7). Instructions 354 may be stored in cache 310, cache 312, and/or another memory associated with core 306 and/or core 308.

$P_{wr}$ may be determined by cores 306, 308 or by a logic unit of cores 306, 308. For example, counters 314, 316 may generate values related to the number of cache write events and the total number of executed instructions for a particular time interval. Cores 306, 308 (or a logic unit of cores 306, 308) may determine $P_{wr}$ as the ratio between the number of cache write events and the total number of executed instructions based on values generated by counter 314 and/or counter 316. Similarly, cores 306, 308 (or a logic unit of cores 306, 308) may determine $P_{rd}$ as the ratio between the number of read instructions and the total number of executed instructions based on values generated by counter 314 and/or counter 316. $T_{miss}$, $T_{wr,B}$, $T_{wr,A}$, $T_{rd,B}$ and $T_{rd,A}$ may be empirically determined or known based on manufacturer specifications.

As discussed previously, core 306 may determine $P_{miss,A}$ by taking a ratio of counter value 330 to counter value 334 for the time interval. Core 306 may determine $P_{miss,A}$ by taking a ratio of counter value 330 to counter value 334 for the time interval.

Core 306 may determine $P_{miss,B}$ by taking a ratio of counter value 332 to counter value 330 for a particular time interval. After determining unknown values of equation (7), core 306 may determine whether the inequality in equation (7) is satisfied. If so, core 306 may migrate thread 301 that is under execution by core 306 to core 308. If not, core 306 may continue to execute thread 301. A latency related to thread migration from one core to another may be added as an additional term to the right hand side of equation (7).

Figure 4:
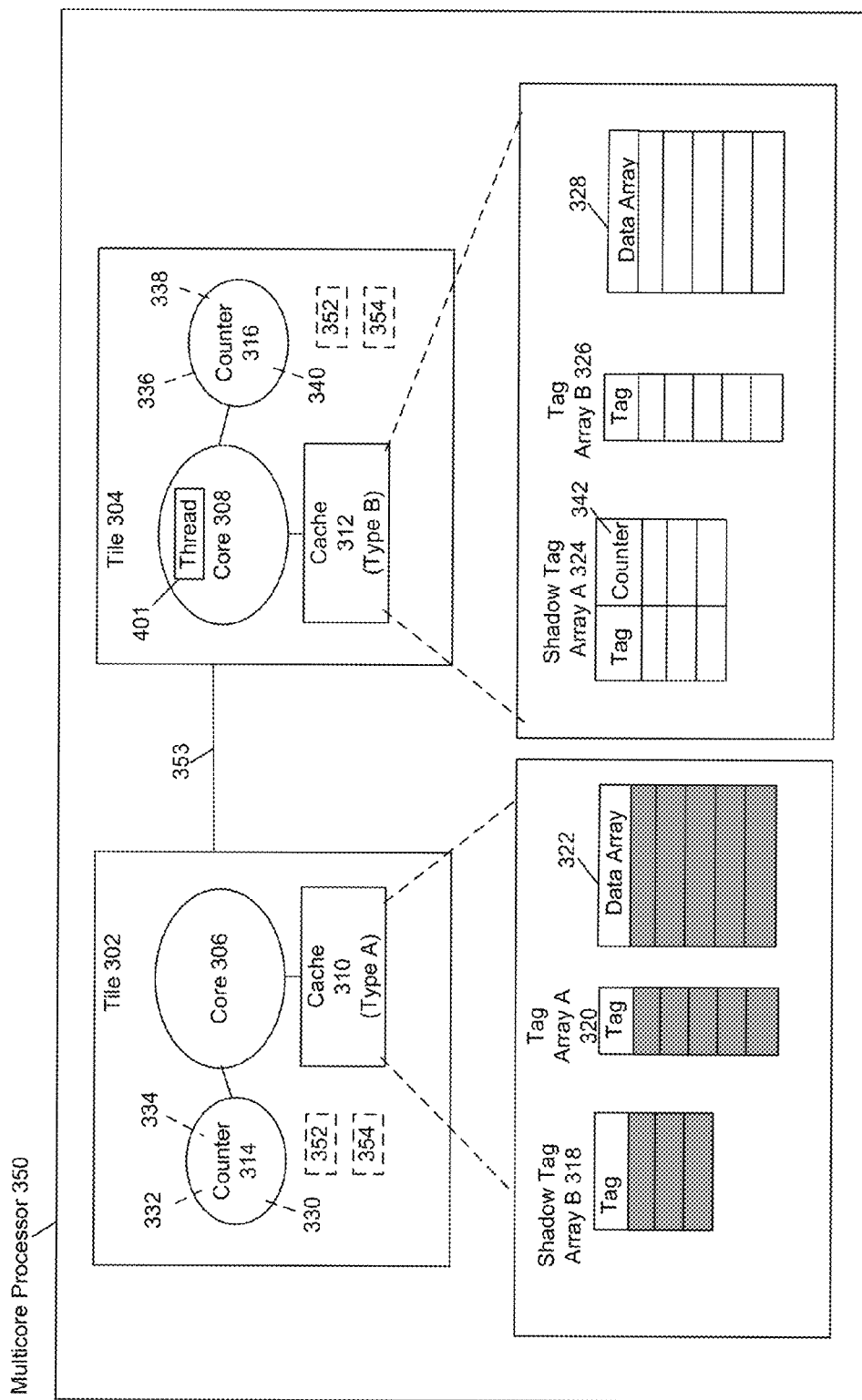
FIG. 4 depicts an example multicore processor that may be used to implement a heterogeneous magnetic memory architecture, including additional details relating to shadow tag arrays which may emulate a second type of memory cells.

FIG. 4 depicts an example multicore processor that may be used to implement a heterogeneous magnetic memory architecture, including additional details relating to shadow tag arrays which may emulate a second type of memory cells, arranged in accordance with at least some embodiments described herein. Those components in FIG. 4 that are labeled identically to components of FIGS. 1, 2, and 3 may not be described again for the purposes of clarity and brevity.

In some examples, it may be more energy efficient for a thread 401 being executed by core 308 to be executed by core 306, in cases where $EPI_B \geq EPI_A$. Equations (2) and (3) above may be rearranged to satisfy $EPI_B \geq EPI_A$ and to produce equation (4) (reproduced below):

$$P_{miss,A} - P_{miss,B} \leq \frac{P_{wr}}{E_{miss}}(E_{wr,B} - E_{wr,A}) \quad (4)$$

For thread 401 that is currently executing on core 308, $P_{miss,B}$ may be determined based on a ratio of the number of cache 312 misses to the total number of instructions executed by core 308. Counter 316 may be used to generate a counter value 336 which may represent the number of instructions executed by core 308 during a time interval. Counter 316 may be used to generate counter value 340 which may represent the number of cache misses experienced by thread 401 executed on core 308 during the time interval. A shadow tag Array A 324 may be a data structure configured to emulate data storage properties of cache 310. Core 308 may be configured to consult tag array B 326 to determine whether data implicated by thread 401 under execution by core 308 may be presently stored in data array 328 If core 308 determines, based on tags stored in tag array B 326, that data implicated by thread 401 currently being executed is not stored in data array 328 (e.g., a "cache miss"), core 308 may instruct counter 316 to increase a counter value 340. Core 308 may determine $P_{miss,B}$ by taking a ratio of counter value 338 to counter value 340 for the time interval. In an example, the time interval may be smaller than a time quantum for an operating system of system 100.

For thread 401 that is currently executing on core 308, $P_{miss,A}$ may be determined based on a ratio of an estimated number of cache misses expected if the thread was executing on a core with a cache of Type A MRAM Cells 112 to the total number of instructions executed by core 308. Shadow tag array A 324 may be a data structure configured to store tags related to data stored in data array 328 of cache 312. In some examples, shadow tag array A 324 may store a representative number of tags which is less than the total number of blocks in data array 328. In some examples, shadow tag array A 324 may include memory cells with a shorter retention time relative to Type B MRAM Cells 114. For example, shadow tag array A 324 may include an array of Type A MRAM Cells 112. In other examples, shadow tag array A 324 may use a counter value 342 to simulate lower retention MRAM cells (lower with respect to Type B MRAM cells being used in cache 312). Counter value 342 may represent a time related to the expiration of a storage time of data stored in a low retention MRAM cache. For example, counter value 342 may be initialized at a value which represents the retention time of lower retention MRAM cells (such as Type A MRAM cells of cache 310). Counter value 342 may be increased and/or decreased periodically by counter 316. When counter value 342 reaches a threshold value (e.g., "3," "0," "−5," etc.), core 308 or cache 312 may determine that a cache miss would have been experienced for the data block signified by the corresponding tag, had the data block been stored in a lower retention MRAM cache, such as cache 310.

Counter 316 may be used to generate counter value 338 which may represent the estimated number of cache misses that would be experienced by a cache of Type A MRAM Cells 112 (such as cache 310, for example) in executing thread 401. Core 308 may determine $P_{miss,A}$ by taking a ratio of counter value 338 to counter value 340 for a particular time interval. After determining all unknown values of equation (4), core 308 may determine whether the inequality in equation (4) is satisfied. If equation (4) is satisfied, suggesting that thread 401 may expend less energy in tile 302, core 308 may migrate thread 401 that is under execution by core 308 to core 306. If not, core 308 may continue to execute thread 401.

Figure 5:
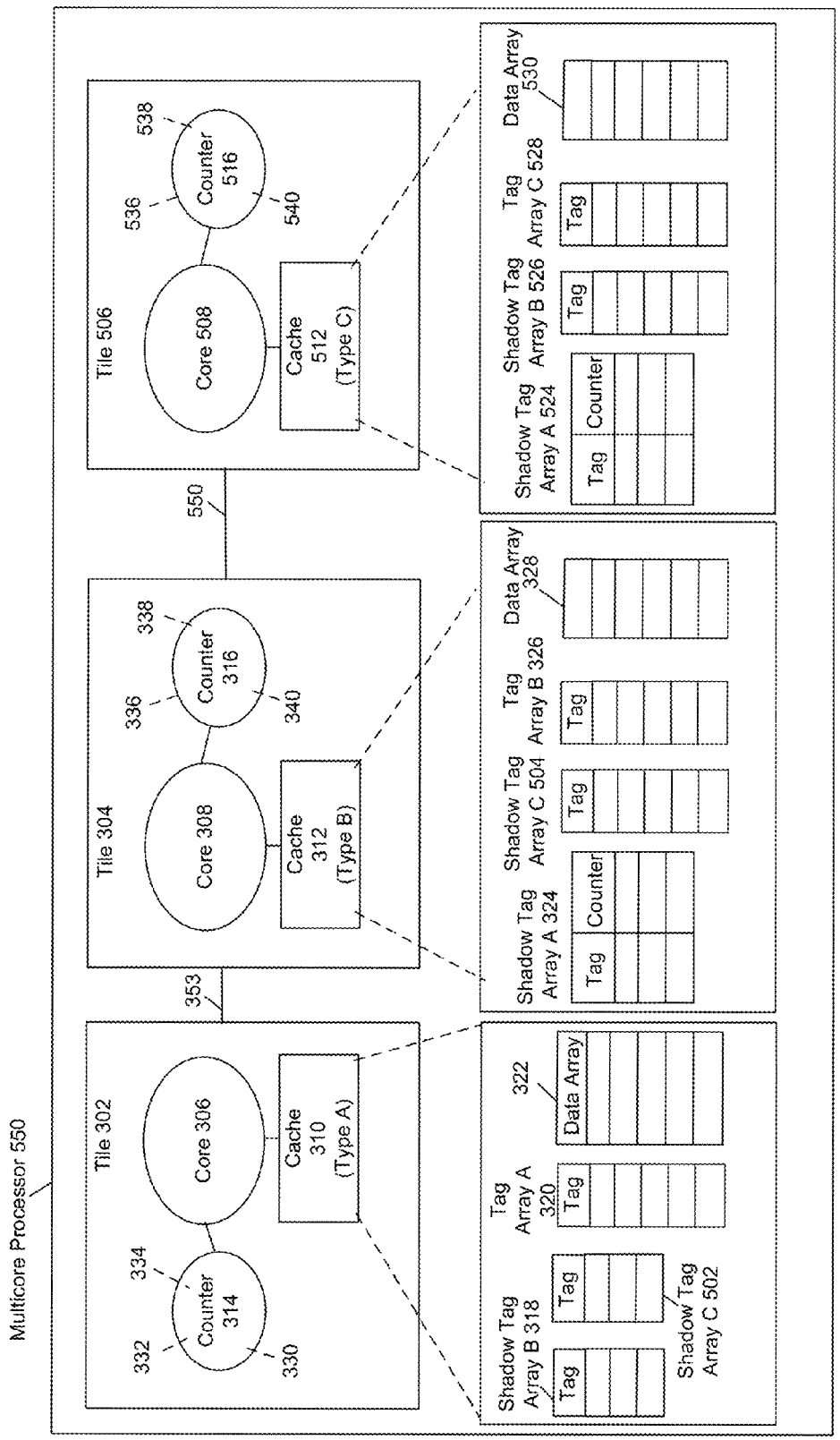
FIG. 5 depicts an example multicore processor that may be used to implement a heterogeneous magnetic memory architecture, including additional details relating to shadow tag arrays which may emulate three different types of memory cells.

FIG. 5 depicts an example multicore processor that may be used to implement a heterogeneous magnetic memory architecture, including a regular tag array plus two shadow tag arrays which may emulate three different types of memory cells, arranged in accordance with at least some embodiments described herein. Those components in FIG. 5 that are labeled identically to components of FIGS. 1, 2, 3 and 4 may not be described again for the purposes of clarity and brevity.

Multicore processor 550 may include tiles 302, 304 and 506. Tile 506 may include a core 508, a counter 516 and/or a cache 512 operatively coupled to each other. Cache 512 may be a Type C cache with a different thickness than caches 310 and 312 and may be on a different die. Tile 506 may be configured to be in communication with either or both tiles 302 and 304 through an interconnect structure 550.

Caches of tiles 302, 304 and/or 506 may have multiple shadow tag arrays. For example, cache 310 may have shadow tag array B 318 and shadow tag array C 502. Shadow tag array B 318 may be effective to emulate storage characteristics of memory cells of cache 312 (such as, for example, data cells of data array 328). Shadow tag array C 502 may be effective to emulate storage characteristics of memory cells of cache 512 (such as, for example, data cells of data array 530).

In some further examples, cache 312 may have shadow tag array A 324 and shadow tag array C 504. Shadow tag array A 324 may be effective to emulate storage characteristics of memory cells of cache 310 (such as, for example, data cells of data array 322). In an example, shadow tag array A 324 may include counter values for tags as discussed previously with respect to FIG. 4. Shadow tag array C 504 may be effective to emulate storage characteristics of memory cells of cache 512 (such as, for example, data cells of data array 530).

In some further examples, cache 512 may have shadow tag array A 524 and shadow tag array B 526. Shadow tag array A 524 may be effective to emulate storage characteristics of memory cells of cache 310 (such as, for example, data cells of data array 322). In an example, shadow tag array A 524 may include counter values for tags as discussed previously with respect to FIG. 4. Shadow tag array B 526 may be effective to emulate storage characteristics of memory cells of cache 312 (such as, for example, data cells of data array 328). Tag array C 528 may be a data structure configured to store tags related to data stored in data array 530 of cache 512.

In some examples, cores 306, 308 and/or 508 may use equations 4 and 7 described above to determine to which core to migrate a particular thread. For example, core 306 may determine that $P_{miss,A} - P_{miss,B}$ exceeds a first threshold value:

$$\frac{P_{wr}}{E_{miss}}(E_{wr,B} - E_{wr,A}),$$

by a greater amount than $P_{miss,A} - P_{miss,C}$ exceeds a second threshold value, $$\frac{P_{wr}}{E_{miss}}(E_{wr,C} - E_{wr,A}).$$

In such a case, core 306 may migrate a thread to core 308 (which may include Type B MRAM Cells 114) rather than core 508 (which may include Type C MRAM Cells 116). In other embodiments, determination of whether or not to migrate a thread can be performed using techniques that do not necessarily implement equations such as the various equations described above. For example, the determination can be made using algorithms, lookup tables or other lookup method, and/or other technique. In some other examples, heuristics may be used to determine whether or not to migrate threads. In another example, programs may be statistically bound to particular processor cores. In some examples, decisions involving thread migration may be performed by an operating system and/or hypervisor of system 100. In another example, a multicore processor (such as, for example, multicore processor 350 and/or 550) may virtualize one or more cores. In this example, threads may be migrated from one physical core to a different physical core without changing a virtual core ID, and thereby may avoid the involvement of the operating system or hypervisor.

In an example, a first core may determine whether a first thread under execution by the first core may be more efficiently executed by a second core. In the example, the second core may already be executing a second thread. The first core may be effective to use a shadow tag array to estimate a probability of a cache miss by the first thread on the second core if the first and second threads were executed simultaneously by the second core. Based on this probability, the first core may determine whether or not to migrate the first thread from the first core to the second core.

Among other features, a heterogeneous magnetic memory architecture in accordance with the present disclosure may allow for lower read latency and energy as compared to multicore processors that use other types of memory such as SRAM and DRAM. A heterogeneous memory architecture may benefit overall power consumption or latency of thread execution. For example, execution of a particular thread on a core including a cache with MRAM memory may consume less power relative to execution of the same thread on a core with a non-MRAM cache or a core with homogeneous MRAM cells. Shadow tag arrays may allow a heterogeneous magnetic memory architecture to determine a core on which to execute a thread, based on memory retention, cache miss percentage, latency and/or power consumption information and/or other factor(s) or combination(s) thereof.

Figure 6:
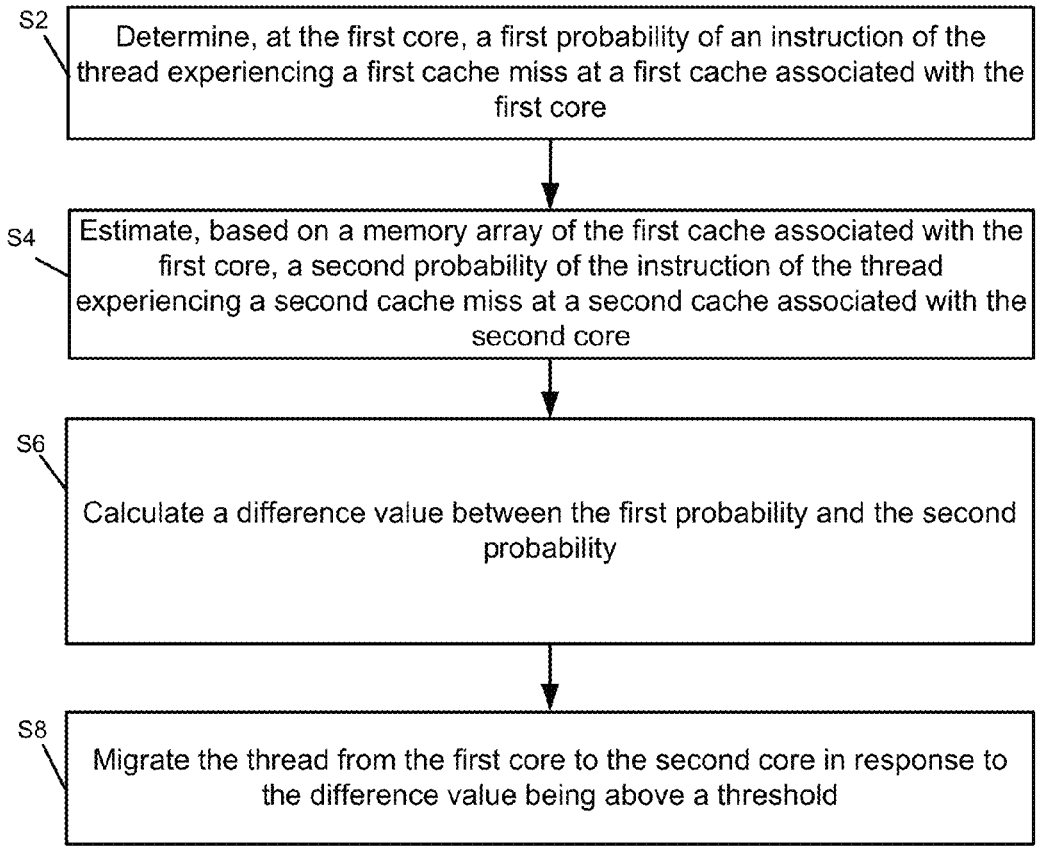
FIG. 6 depicts a flow diagram for an example process to operate a heterogeneous magnetic memory architecture.

FIG. 6 depicts a flow diagram for example process to operate a heterogeneous magnetic memory architecture, arranged in accordance with at least some embodiments described herein. In some examples, the process in FIG. 6 could be implemented using system 100 discussed above and could be used to migrate a thread. An example process may include one or more operations, actions, or functions as illustrated by one or more of blocks S2, S4, S6, and/or S8, etc. Although illustrated as discrete blocks, various blocks may be divided into additional blocks, combined into fewer blocks, or eliminated, depending on the particular implementation. Blocks may be supplemented with additional blocks representing other operations, actions, or functions. The process in FIG. 6 may be used by a multicore processor, such as multicore processor 150, 250, 350 or 550, as described above. The multicore processor may include one or more cores (e.g., core 120, core 122, and/or core 124) and one or more caches (e.g., cache 126, cache 128, and/or cache 130).

Processing may begin at block S2, "Determine, at the first core, a first probability of an instruction of the thread experiencing a first cache miss at a first cache associated with the first core." At block S2, a first probability of an instruction of the thread experiencing a first cache miss at a first cache (e.g., cache 310) associated with the first core (e.g., core 306) may be determined by, for example, core 306 based on instructions 352.

Processing may continue from block S2 to block S4, "Estimate, based on a memory array of the first cache associated with the first core, a second probability of the instruction of the thread experiencing a second cache miss at a second cache associated with the second core." At block S4, a second probability of the instruction of the thread experiencing a second cache miss at a second cache associated with the second core may be estimated, for example by core 306, based on instructions 352, based on a memory array (e.g., shadow tag array B 318) of a first cache (e.g., cache 310) of the first core (e.g., core 306).

Processing may continue from block S4 to block S6, "Calculate a difference value between the first probability and the second probability." At block S6, a difference value between the first probability and the second probability may be calculated or otherwise determined. For example, the difference value may be calculated by core 306, using equation 4 or equation 7, as described above, or by using some other suitable technique. In some examples, the difference value may include a first difference value. A third probability of the instruction of the thread experiencing a third cache miss at a third cache (e.g., cache 512) of a third core (e.g., core 508) may be estimated by, for example, core 306. A second difference value between the first probability and the third probability may be calculated by, for example, core 306 based on instructions 352.

Processing may continue from block S6 to block S8, "Migrate the thread from the first core to the second core in response to the difference value being above a threshold." At block S8, the thread may be migrated from the first core (e.g., core 306) to the second core (e.g., core 308) in response to the difference value being above a threshold. In an example, the threshold may be the right hand side of the inequality described in equation 4 and/or equation 7. In another example, the threshold may relate to a first power consumption value that pertains to execution of the thread at the first core and a second power consumption value that pertains to execution of the thread at the second core. The threshold and whether the threshold is met or exceeded may be determined using techniques that do not necessarily involve equations. In various other examples, the threshold may relate to a first time to execute the thread by the first core and a second time to execute the thread by the second core. In other examples, the threshold may relate to a time to migrate the thread from the first core to the second core and energy to migrate the thread from the first core to the second core. The thread may be migrated from the first core (e.g., core 306) to the third core (e.g., core 508) based on the second difference value being greater than the first difference value. In one example, core 306 or core 308 may control the migration in block S8 from one core to another core.

FIG. 7 illustrates an example computer program product 700 that can be utilized to operate a heterogeneous magnetic memory architecture arranged in accordance with at least some embodiments described herein. Program product 700 may include a signal bearing medium 702. Signal bearing medium 702 may include one or more instructions 704 that, in response to execution by, for example, a processor, may provide the functionality and features described above with respect to FIGS. 1-6. Thus, for example, referring to system 100, multicore processor 150 may undertake one or more of the blocks shown in FIG. 7 in response to instructions 704 conveyed to system 100 by medium 702.

In some implementations, signal bearing medium 702 may encompass a computer-readable medium 706, such as, but not limited to, a hard disk drive, a Compact Disc (CD), a Digital Video Disk (DVD), a digital tape, memory, etc. In some implementations, signal bearing medium 702 may encompass a recordable medium 708, such as, but not limited to, memory, read/write (R/W) CDs, R/W DVDs, etc. In some implementations, signal bearing medium 702 may encompass a communications medium 710, such as, but not limited to, a digital and/or an analog communication medium (e.g., a fiber optic cable, a waveguide, a wired communications link, a wireless communication link, etc.). Thus, for example, program product 700 may be conveyed to one or more modules of the system 100 by an RF signal bearing medium 702, where the signal bearing medium 702 is conveyed by a wireless communications medium 710 (e.g., a wireless communications medium conforming with the IEEE 802.11 standard).

Figure 8:
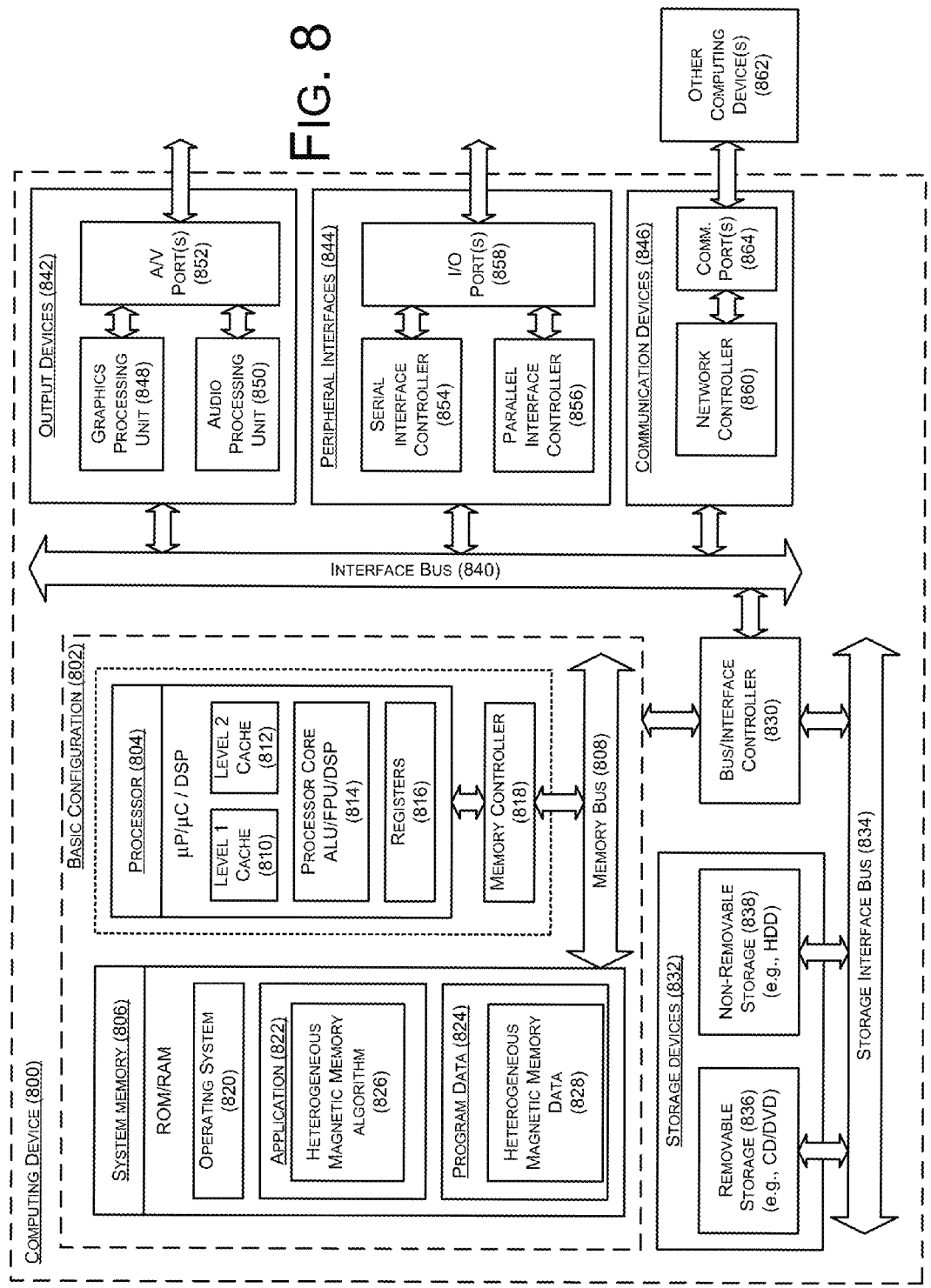
FIG. 8 is a block diagram illustrating an example computing device that is arranged to implement a heterogeneous magnetic memory architecture.

FIG. 8 is a block diagram illustrating an example computing device 800 that is arranged to implement a heterogeneous magnetic memory architecture, arranged in accordance with at least some embodiments described herein. In a very basic configuration 802, computing device 800 typically includes one or more processors 804 and a system memory 806. A memory bus 808 may be used for communicating between processor 804 and system memory 806.

Depending on the desired configuration, processor 804 may be of any type including but not limited to a microprocessor ($\mu P$), a microcontroller ($\mu C$), a digital signal processor (DSP), or any combination thereof. Processor 804 may include one more levels of caching, such as a level one cache 810 and a level two cache 812, a processor core 814, and registers 816. Cache 810 and/or cache 812 may include MRAM cells in some examples. An example processor core 814 may include an arithmetic logic unit (ALU), a floating point unit (FPU), a digital signal processing core (DSP core), or any combination thereof. An example memory controller 818 may also be used with processor 804, or in some implementations memory controller 818 may be an internal part of processor 804.

Depending on the desired configuration, system memory 806 may be of any type including but not limited to volatile memory (such as RAM), non-volatile memory (such as ROM, flash memory, etc.) or any combination thereof. System memory 806 may include an operating system 820, one or more applications 822, and program data 824. Application 822 may include a heterogeneous magnetic memory algorithm 826 that is arranged to perform the functions and operations as described herein including those described with respect to FIGS. 1-7 in connection with system 100. In one embodiment, algorithm 826 may integrate the various equations described above that are usable to determine whether or not to migrate a thread. In other embodiments, the algorithm 826 may be operable to make such determination without necessarily implementing the equations. Program data 824 may include heterogeneous magnetic memory data 828 that may be useful to implement a heterogeneous magnetic memory architecture as is described herein. In some examples, shadow tag array B 318 and/or shadow tag array A 324 may be included in program data 824. In further examples, shadow tag array B 318 and/or shadow tag array A 324 may be stored in level 1 cache 810 or level 2 cache 812. In some embodiments, application 822 may be arranged to operate in cooperation with program data 824 and/or operating system 820 such that a heterogeneous magnetic memory architecture may be provided. This described basic configuration 802 is illustrated in FIG. 8 by those components within the inner dashed line.

Computing device 800 may have additional features or functionality, and additional interfaces to facilitate communications between basic configuration 802 and any required devices and interfaces. For example, a bus/interface controller 830 may be used to facilitate communications between basic configuration 802 and one or more data storage devices 832 via a storage interface bus 834. Data storage devices 832 may be removable storage devices 836, non-removable storage devices 838, or a combination thereof. Examples of removable storage and non-removable storage devices include magnetic disk devices such as flexible disk drives and hard-disk drives (HDDs), optical disk drives such as compact disk (CD) drives or digital versatile disk (DVDs) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 806, removable storage devices 836 and non-removable storage devices 838 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 800. Any such computer storage media may be part of computing device 800.

Computing device 800 may also include an interface bus 840 for facilitating communication from various interface devices (e.g., output devices 842, peripheral interfaces 844, and communication devices 846) to basic configuration 802 via bus/interface controller 830. Example output devices 842 include a graphics processing unit 848 and an audio processing unit 850, which may be configured to communicate to various external devices such as a display or speakers via one or more A/V ports 852. Example peripheral interfaces 844 include a serial interface controller 854 or a parallel interface controller 856, which may be configured to communicate with external devices such as input devices (e.g., keyboard, mouse, pen, voice input device, touch input device, etc.) or other peripheral devices (e.g., printer, scanner, etc.) via one or more I/O ports 858. An example communication device 846 includes a network controller 860, which may be arranged to facilitate communications with one or more other computing devices 862 over a network communication link via one or more communication ports 864.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 800 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). If a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, a range includes each individual member. Thus, for example, a group having 1-3 Cells refers to groups having 1, 2, or 3 Cells. Similarly, a group having 1-5 Cells refers to groups having 1, 2, 3, 4, or 5 Cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A multicore processor, comprising:
a die;
a first tile on the die, wherein the first tile includes a first core and a first cache configured to be in communication with the first core, wherein the first cache includes first magnetoresistive random access memory (MRAM) cells with first storage characteristics, which include a first retention time, based on first dimensions of layers within the first MRAM cells, and wherein the first cache further includes a first array of memory cells;
a second tile on the die, wherein the second tile includes a second core and a second cache configured to be in communication with the second core, wherein the second cache includes second MRAM cells with second storage characteristics, which include a second retention time, based on second dimensions of layers within the second MRAM cells, wherein the second cache further includes a second array of memory cells, wherein the second storage characteristics are different from the first storage characteristics, wherein the first array of memory cells is effective to emulate the second storage characteristics of the second MRAM cells, and wherein the second array of memory cells is effective to emulate the first storage characteristics of the first MRAM cells;
a counter configured to be in communication with at least one of the first core and the second core, wherein the counter is effective to generate a counter value that represents a time related to an expiration of a storage time of data stored in the first MRAM cells or the second MRAM cells, wherein the counter value is initialized at a value that represents the first retention time of the first MRAM cells or the second retention time of the second MRAM cells, and wherein:
the first array of memory cells is effective to emulate the second retention time of the second MRAM cells based on the counter value, or
the second array of memory cells is effective to emulate the first retention time of the first MRAM cells based on the counter value; and
an interconnect structure coupled to the first tile and the second tile, and configured to provide communication between the first tile and the second tile.

2. The multicore processor of claim 1, wherein the first core is configured to:
determine a first power consumption of a thread if executed by the first core;
estimate a second power consumption of the thread if executed by the second core; and
migrate the thread from the first core to the second core via the interconnect structure, based upon a determination that the first power consumption is greater than the second power consumption.

3. The multicore processor of claim 1, wherein the first core is configured to:
determine a first latency of a thread if executed by the first core;
estimate a second latency of the thread if executed by the second core; and
migrate the thread from the first core to the second core via the interconnect structure, based upon a determination that the first latency is greater than the second latency.

4. The multicore processor of claim 1, wherein the die includes a first die, and wherein the multicore processor further comprises:
a second die configured to be in communication with the first die, wherein the second die includes a third tile with a third core configured to be in communication with a third cache, wherein the third cache includes third MRAM cells with third storage characteristics, and wherein the third storage characteristics are different from at least one of the first storage characteristics and the second storage characteristics.

5. The multicore processor of claim 1, wherein each of the first MRAM cells and the second MRAM cells includes a respective cap layer, free magnetic layer, reference magnetic layer, insulation layer, and an electrode, and wherein the respective insulation layers are disposed between the respective free magnetic layers and the respective reference magnetic layers.

6. The multicore processor of claim 5, wherein the die includes a first die, wherein the multicore processor further comprises a second die configured to be in communication with the first die, and wherein:
the second die includes a third tile with a third core configured to be in communication with a third cache, wherein the third cache includes third MRAM cells with third storage characteristics based on third dimensions of layers within the third MRAM cells, and wherein the third storage characteristics are different from at least one of the first storage characteristics and the second storage characteristics,
the respective cap layers, free magnetic layers, reference magnetic layers, and insulation layers of the first MRAM cells and the second MRAM cells are of a first insulation thickness, and
cap layers, free magnetic layers, reference magnetic layers, and insulation layers of the third MRAM cells are of a second insulation thickness, wherein the second insulation thickness is different from the first insulation thickness.

7. The multicore processor of claim 1, wherein the first MRAM cells have a first footprint and the second MRAM cells have a second footprint, and wherein the first footprint is different from the second footprint.

8. A method to migrate a thread from a first core to a second core on a multicore processor, the method comprising:
- determining, at the first core, a first probability of an instruction of the thread experiencing a first cache miss on first magnetoresistive random access memory (MRAM) cells, wherein the first MRAM cells have a first storage characteristic based on first dimensions of layers within the first MRAM cells;
- estimating, based on a shadow tag array stored in a memory array of a first cache associated with the first core, a second probability of the instruction of the thread experiencing a second cache miss on second MRAM cells, wherein the second MRAM cells have a second storage characteristic, which includes a characteristic retention time, based on second dimensions of layers within the second MRAM cells, wherein the shadow tag array emulates the characteristic retention time of the second MRAM cells based on a counter value that represents a time related to an expiration of a storage time of data stored in the second MRAM cells, wherein the counter value is initialized at a value that represents the characteristic retention time of the second MRAM cells, and wherein the second storage characteristic is different from the first storage characteristic;
- calculating a difference value between the first probability and the second probability; and
- migrating the thread from the first core to the second core in response to the difference value being above a threshold.

9. The method of claim 8, wherein the threshold is related to a first power consumption value that pertains to execution of the thread at the first core and a second power consumption value that pertains to execution of the thread at the second core.

10. The method of claim 8, wherein the threshold is related to a first time to execute the thread by the first core and a second time to execute the thread by the second core.

11. The method of claim 8, wherein the threshold is related to a time to migrate the thread from the first core to the second core and energy to migrate the thread from the first core to the second core.

12. The method of claim 8, wherein the difference value includes a first difference value, and wherein the method further comprises:
- estimating, at the first core, a third probability of the instruction of the thread experiencing a third cache miss on third MRAM cells, wherein the third MRAM cells have a third storage characteristic based on third dimensions of layers within the third MRAM cells;
- calculating a second difference value between the first probability and the third probability; and
- migrating the thread from the first core to the third core based on a determination that the second difference value is greater than the first difference value.

13. A multicore processor, comprising:
- a die;
- a first tile on the die, wherein the first tile includes a first core and a first cache configured to be in communication with the first core, wherein the first cache includes first magnetoresistive random access memory (MRAM) cells with first storage characteristics, which include a first retention time, based on first dimensions of layers within the first MRAM cells, and wherein the first cache further includes an array of second MRAM cells with second storage characteristics based on second dimensions of layers within the second MRAM cells;
- a second tile on the die, wherein the second tile includes a second core and a second cache configured to be in communication with the second core, and wherein the second cache includes:
  - third MRAM cells with third storage characteristics, which include a second retention time, based on third dimensions of layers within the third MRAM cells, wherein the third storage characteristics are different from the first storage characteristics; and
  - fourth MRAM cells with fourth storage characteristics based on fourth dimensions of layers within the fourth MRAM cells, wherein the second MRAM cells are configured to emulate the third storage characteristics of the third MRAM cells, and wherein the fourth MRAM cells are configured to emulate the first storage characteristics of the first MRAM cells;
- a counter configured to be in communication with at least one of the first core and the second core, wherein the counter is effective to generate a counter value that represents a time related to an expiration of a storage time of data stored in the first MRAM cells or the third MRAM cells, wherein the counter value is initialized at a value that represents the first retention time of the first MRAM cells or the second retention time of the third MRAM cells, and wherein:
  - the second MRAM cells are configured to emulate the second retention time of the third MRAM cells based on the counter value, or
  - the fourth MRAM cells are configured to emulate the first retention time of the first MRAM cells based on the counter value; and
- an interconnect structure coupled to the first tile and the second tile, and configured to provide communication between the first tile and the second tile.

14. The multicore processor of claim 13, wherein the first core is configured to estimate a number of cache misses of a thread if executed by the second core, based on data stored in the second MRAM cells.

15. The multicore processor of claim 13, wherein the first core is configured to estimate a first number of cache misses of a first thread if executed by the second core, based on first data stored in the second MRAM cells, and wherein the second core is configured to estimate a second number of cache misses of a second thread if executed by the first core, based on second data stored in the fourth MRAM cells.

16. The multicore processor of claim 13, wherein the die includes a first die, the interconnect structure includes a first interconnect structure, and the multicore processor further comprises:
- a second die;
- a third tile on the second die, wherein the third tile includes a third core and a third cache configured to be in communication with the third core, and wherein the third cache includes:
  - fifth MRAM cells with fifth storage characteristics based on fifth dimensions of layers within the fifth MRAM cells; and
  - sixth MRAM cells with sixth storage characteristics based on sixth dimensions of layers within the sixth MRAM cells; and
- a second interconnect structure coupled to the first die and the second die, and configured to provide communication between the first die and the second die.

17. The multicore processor of claim 16, wherein:
the third cache further includes seventh MRAM cells with seventh storage characteristics based on seventh dimensions of layers within the seventh MRAM cells,
the sixth MRAM cells are configured to emulate the first storage characteristics of the first MRAM cells, and
the seventh MRAM cells are configured to emulate the third storage characteristics of the third MRAM cells.

18. A non-transitory computer-readable medium that includes computer-readable instructions stored thereon that are executable by the multicore processor to perform or cause to be performed the method of claim 8.

* * * * *

UNITED STATES PATENT AND TRADEMARK OFFICE
CERTIFICATE OF CORRECTION

PATENT NO. : 9,858,111 B2  
APPLICATION NO. : 14/308262  
DATED : January 2, 2018  
INVENTOR(S) : Solihin Page 1 of 2

It is certified that error appears in the above-identified patent and that said Letters Patent is hereby corrected as shown below:

On the Title Page

In Item (73), under "Assignee", in Column 1, Lines 1-3, delete "EMPIRE TECHNOLOGIES DEVELOPMENT LLC, Wilmington, DE (US)" and insert -- EMPIRE TECHNOLOGY DEVELOPMENT LLC, Wilmington, DE (US) --, therefor.

On the Page 2, in Item (56), under "OTHER PUBLICATIONS", in Column 1, Line 8, delete "Retreived from" and insert -- Retrieved from --, therefor.

In the Specification

In Column 3, Line 8, delete "architecture;" and insert -- architecture; and --, therefor.

In Column 3, Line 11, delete "architecture;" and insert -- architecture, --, therefor.

In Column 12, Line 28, delete "diagram for example" and insert -- diagram, for example, --, therefor.

In Column 13, Line 44, delete "Program product 700" and insert -- Computer program product 700 --, therefor.

In Column 13, Line 52, delete "medium 702." and insert -- signal bearing medium 702. --, therefor.

In Column 13, Line 65, delete "program product 700" and insert -- computer program product 700 --, therefor.

In Column 14, Line 16, delete "one more" and insert -- one or more --, therefor.

In Column 14, Line 24, delete "implementations memory" and insert -- implementations, memory --, therefor.

Signed and Sealed this  
Fifth Day of June, 2018

Andrei Iancu  
*Director of the United States Patent and Trademark Office*

CERTIFICATE OF CORRECTION (continued)
U.S. Pat. No. 9,858,111 B2

In Column 16, Line 25, delete "recitation no" and insert -- recitation, no --, therefor.

In Column 16, Line 47, delete "general such" and insert -- general, such --, therefor.

In Column 16, Line 54, delete "general such" and insert -- general, such --, therefor.

In the Claims

In Column 18, Line 56, in Claim 6, delete "layers, and insulation" and insert -- layers, insulation --, therefor.